United States Patent
Salman et al.

(10) Patent No.: US 11,302,688 B2
(45) Date of Patent: Apr. 12, 2022

(54) ESD PROTECTION CIRCUIT WITH ISOLATED SCR FOR NEGATIVE VOLTAGE OPERATION

(71) Applicant: Texas Instruments Incorporated, Dallas, TX (US)

(72) Inventors: Akram A. Salman, Plano, TX (US); Farzan Farbiz, Dallas, TX (US); Amitava Chatterjee, Plano, TX (US); Xiaoju Wu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 119 days.

(21) Appl. No.: 16/054,037

(22) Filed: Aug. 3, 2018

(65) Prior Publication Data
US 2018/0350795 A1    Dec. 6, 2018

Related U.S. Application Data

(62) Division of application No. 14/750,339, filed on Jun. 25, 2015, now Pat. No. 10,083,951, which is a (Continued)

(51) Int. Cl.
*H01L 27/02* (2006.01)
*H01L 29/73* (2006.01)
(Continued)

(52) U.S. Cl.
CPC ...... *H01L 27/0262* (2013.01); *H01L 29/1012* (2013.01); *H01L 29/7424* (2013.01); *H01L 29/7436* (2013.01)

(58) Field of Classification Search
CPC ...... H01L 21/33; H01L 29/73; H01L 27/0266
See application file for complete search history.

(56) References Cited

U.S. PATENT DOCUMENTS 5,889,315 A * 3/1999 Farrenkopf ........... H01L 21/761
257/552
6,023,293 A    2/2000 Watanabe et al.
(Continued)

*Primary Examiner* — Kenneth Parker
*Assistant Examiner* — Long H Le
(74) *Attorney, Agent, or Firm* — Jacqueline J. Garner; Charles A. Brill; Frank D. Cimino

(57) ABSTRACT

A semiconductor controlled rectifier (FIG. 4A) for an integrated circuit is disclosed. The semiconductor controlled rectifier comprises a first lightly doped region (100) having a first conductivity type (N) and a first heavily doped region (108) having a second conductivity type (P) formed within the first lightly doped region. A second lightly doped region (104) having the second conductivity type is formed proximate the first lightly doped region. A second heavily doped region (114) having the first conductivity type is formed within the second lightly doped region. A buried layer (101) having the first conductivity type is formed below the second lightly doped region and electrically connected to the first lightly doped region. A third lightly doped region (102) having the second conductivity type is formed between the second lightly doped region and the third heavily doped region. A fourth lightly doped region (400) having the second conductivity type is formed between the second lightly doped region and the third heavily doped region and electrically connected to the second and third lightly doped regions.

23 Claims, 7 Drawing Sheets

Related U.S. Application Data division of application No. 13/668,022, filed on Nov. 2, 2012, now Pat. No. 9,099,523.

(51) Int. Cl.
*H01L 29/74* (2006.01)
*H01L 29/10* (2006.01)

(56) References Cited

U.S. PATENT DOCUMENTS

| | | |
|---|---|---|
| 6,765,771 B2 | 7/2004 | Ker |
| 7,601,991 B2 | 10/2009 | Salcedo et al. |
| 7,719,026 B2 | 5/2010 | Lou et al. |
| 8,193,560 B2 | 6/2012 | Gendron et al. |
| 8,283,727 B1 | 10/2012 | Walker et al. |
| 2002/0050615 A1 | 5/2002 | Ker et al. |
| 2003/0173624 A1 | 9/2003 | Choi et al. |
| 2004/0016992 A1* | 1/2004 | Mallikarjunaswamy .................... H01L 29/87 257/546 |
| 2006/0261408 A1* | 11/2006 | Khemka ............... H01L 29/063 257/335 |
| 2007/0131965 A1 | 6/2007 | Kim et al. |
| 2008/0012044 A1 | 1/2008 | Salcedo et al. |
| 2009/0236631 A1* | 9/2009 | Chen .................. H01L 27/0262 257/109 |
| 2010/0320501 A1* | 12/2010 | Gendron ............ H01L 27/0259 257/173 |
| 2011/0049621 A1 | 3/2011 | Lotfi et al. |
| 2011/0176244 A1 | 7/2011 | Gendron et al. |
| 2012/0092798 A1 | 4/2012 | Hwang |

\* cited by examiner

ESD PROTECTION CIRCUIT WITH ISOLATED SCR FOR NEGATIVE VOLTAGE OPERATION

CROSS REFERENCE TO RELATED APPLICATIONS

This application is a divisional of U.S. Nonprovisional patent application Ser. No. 14/750,339, filed Jun. 25, 2015, which is a divisional of U.S. Nonprovisional patent application Ser. No. 13/668,022, filed Nov. 2, 2012 (now U.S. Pat. No. 9,099,523), the contents of both of which are herein incorporated by reference in its entirety.

BACKGROUND OF THE INVENTION

Embodiments of the present embodiments relate to an isolated semiconductor controlled rectifier (SCR) circuit for electrostatic discharge (ESD) protection. A preferred embodiment of the circuit is intended for use at input, output, or input-output terminals having a negative operating voltage with respect to GND or VSS, but the circuit may also be used between power supply terminals such as VDD and GND or VSS terminals of an integrated circuit.

Referring to FIGS. 1-3, there is an ESD protection circuit of the prior art that is similar to those disclosed by Ker et al. in U.S. Pat. No. 6,765,771. The plan view of FIG. 1 illustrates a dual semiconductor controlled rectifier formed on p-type substrate (PSUB) 102 and surrounded by n-type well (NWELL) 100. The PSUB layer 102 is electrically connected to P+ region 112. The dual SCRs are formed symmetrically above and below P+ region 112, so only the lower SCR will be described in detail. Here and in the following discussion the same reference numerals are used to identify the same or similar circuit elements in the various drawing figures. N+ region 114 is the cathode of the lower SCR and is formed adjacent P+ region 112 within p-type well region 104. P+ region 108 is formed within NWELL 100 and serves as an anode for the lower SCR. N+ region 106 is electrically connected to NWELL 100. Gate region 110 is formed over a boundary between NWELL 100 and PSUB 102. Gate region 110, P+ anode 108, and N+ region 106 are electrically connected to reference terminal 122, which is preferably GND or VSS. P+ region 112 and N+ region 114 are electrically connected to terminal 120, which is preferably an input, output, or input-output terminal to be protected.

Referring next to FIG. 2, there is a cross sectional diagram of the lower SCR along the plane A-A' as indicated by the line in FIG. 1. The SCR is formed on P-type substrate (PSUB) 200. N-type buried layer (NBL) 101 is formed in PSUB 200 below the surface by ion implantation. Taken together n-type well (NWELL) 100 and NBL 101 form an isolated P-type region (PSUB) 102. The lower SCR includes P+ anode 108 formed in NWELL 100 and N+ cathode 114 formed in p-type well region 104. Active P+ regions 112 and 108, N+ regions 114 and 106, and the channel region below gate 110 are separated by shallow trench isolation (STI) regions 124.

Turning now to FIG. 3, there is a simplified diagram of the SCR of FIG. 2 showing individual bipolar transistors. Shallow trench isolation (STI) regions are omitted for clarity. The lower SCR of FIG. 2 comprises a vertical SCR and a horizontal SCR. The vertical SCR includes PNP transistor 304 and NPN transistor 306 and forms a vertical current path from P+ anode 108 to NBL 101 via NWELL 100 and back to N+ cathode 114 via PSUB 102. The horizontal SCR includes PNP transistor 300 and NPN transistor 302 and forms a horizontal current path directly from P+ anode 108 to N+ cathode 114. Parasitic resistor 301 is a base-emitter shunt resistor for PNP transistor 300. Parasitic resistor 303 is a base-emitter shunt resistor for NPN transistors 302 and 306.

Several problems arise with operation of the SCR of FIGS. 1-3 that limit operating voltage, gain of the SCR, and introduce reliability problems as will become apparent in the following discussions. Various embodiments of the present invention are directed to solving these problems and improving operation of the SCR without increasing process complexity.

BRIEF SUMMARY OF THE INVENTION

In a preferred embodiment of the present invention, a semiconductor controlled rectifier for protecting an integrated circuit is disclosed. The semiconductor controlled rectifier includes a first lightly doped region having a first conductivity type formed proximate a second lightly doped region having a second conductivity type. A first heavily doped region having the second conductivity type is formed within the first lightly doped region. A second heavily doped region having the first conductivity type is formed within the second lightly doped region. A buried layer having the first conductivity type is formed below the second lightly doped region and electrically connected to the first lightly doped region. A third lightly doped region having the second conductivity type is formed between the second lightly doped region and the third heavily doped region. A fourth lightly doped region having the second conductivity type is formed between the second lightly doped region and the third heavily doped region and electrically connected to the second and third lightly doped regions.

DETAILED DESCRIPTION OF THE INVENTION

The preferred embodiments of the present invention provide significant advantages over electrostatic discharge (ESD) protection circuits of the prior art as will become evident from the following detailed description.

Figure 4A:
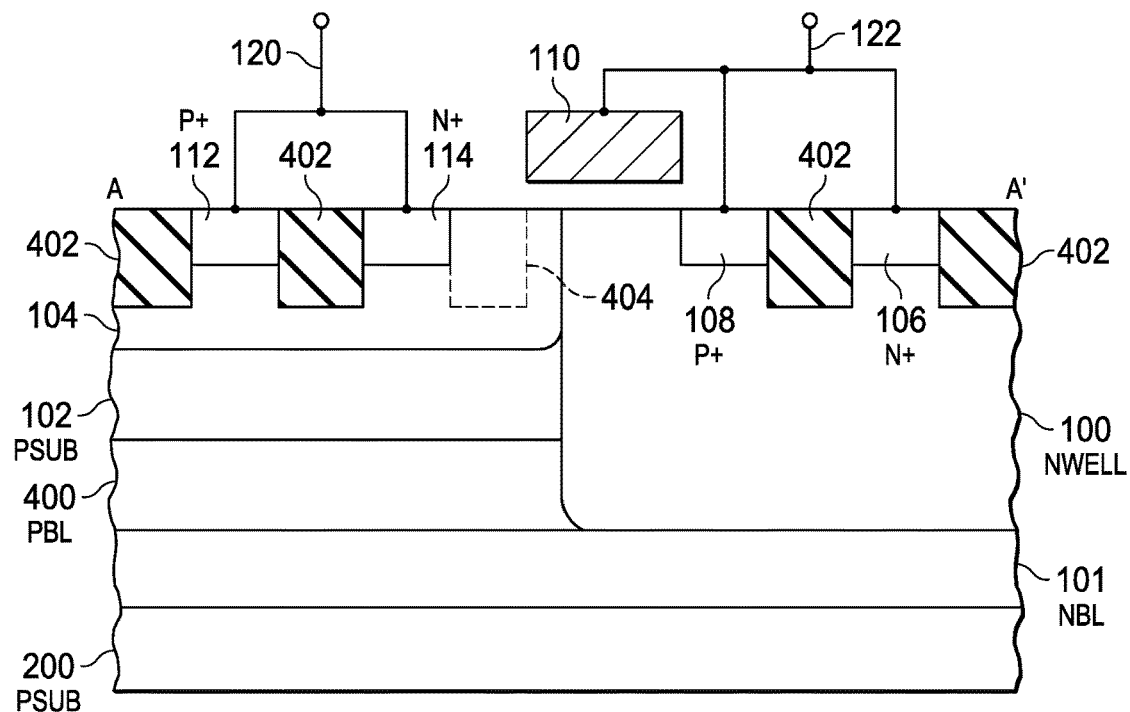
FIG. 4A is a cross sectional diagram of a first embodiment of an SCR of the present invention.

Referring to FIG. 4A, there is a cross sectional diagram of a first embodiment of a semiconductor controlled rectifier (SCR) of the present invention. Here and in the following discussion, SCR refers to a semiconductor controlled rectifier rather than a silicon controlled rectifier, which is a special case of a semiconductor controlled rectifier. In general, heavily doped means a semiconductor region having a concentration of 1e18 Acm$^{-3}$ or greater. Likewise, lightly doped means a semiconductor region having a concentration of less than 1e18 Acm$^{-3}$. In both cases, the doped regions may be formed by ion implantation or other methods as are well known to those having ordinary skill in the art. Furthermore, the drawing figures are not to scale but are drawn to clearly illustrate important features of the present invention. In the following discussion, the term "electrically connected" means an ohmic current path exists between two or more cited elements and does not preclude the existence of resistors, parasitic elements, or other circuit elements within the current path as is well known in the art.

The SCR of FIG. 4A is formed on P-type substrate (PSUB) 200. N-type buried layer (NBL) 101 is formed in PSUB 200 below the surface preferably by ion implantation. Taken together n-type well (NWELL) 100 and NBL 101 form an isolated p-type region (PSUB) 102 with the same impurity type and concentration as PSUB 200. The SCR includes P+ anode 108 formed in NWELL 100 and N+ cathode 114 formed in p-type well region 104. N+ region 106 electrically connects NWELL region 100 to reference terminal 122, which may be VSS, ground, or another suitable reference terminal. Reference terminal 122 is also connected to P+ anode 108 and gate region 110. P+ region 112 electrically connects p-type well 104 to terminal 120, which may be an input, output, input-output, or another reference terminal. Terminal 120 is also connected to N+ cathode 114. Active P+ regions 112 and 108, N+ regions 114 and 106, and the channel region below gate 110 are separated by shallow trench isolation (STI) regions 402 and 404. STI region 404 may optionally be omitted to improve the gain of the horizontal SCR.

Figure 1:
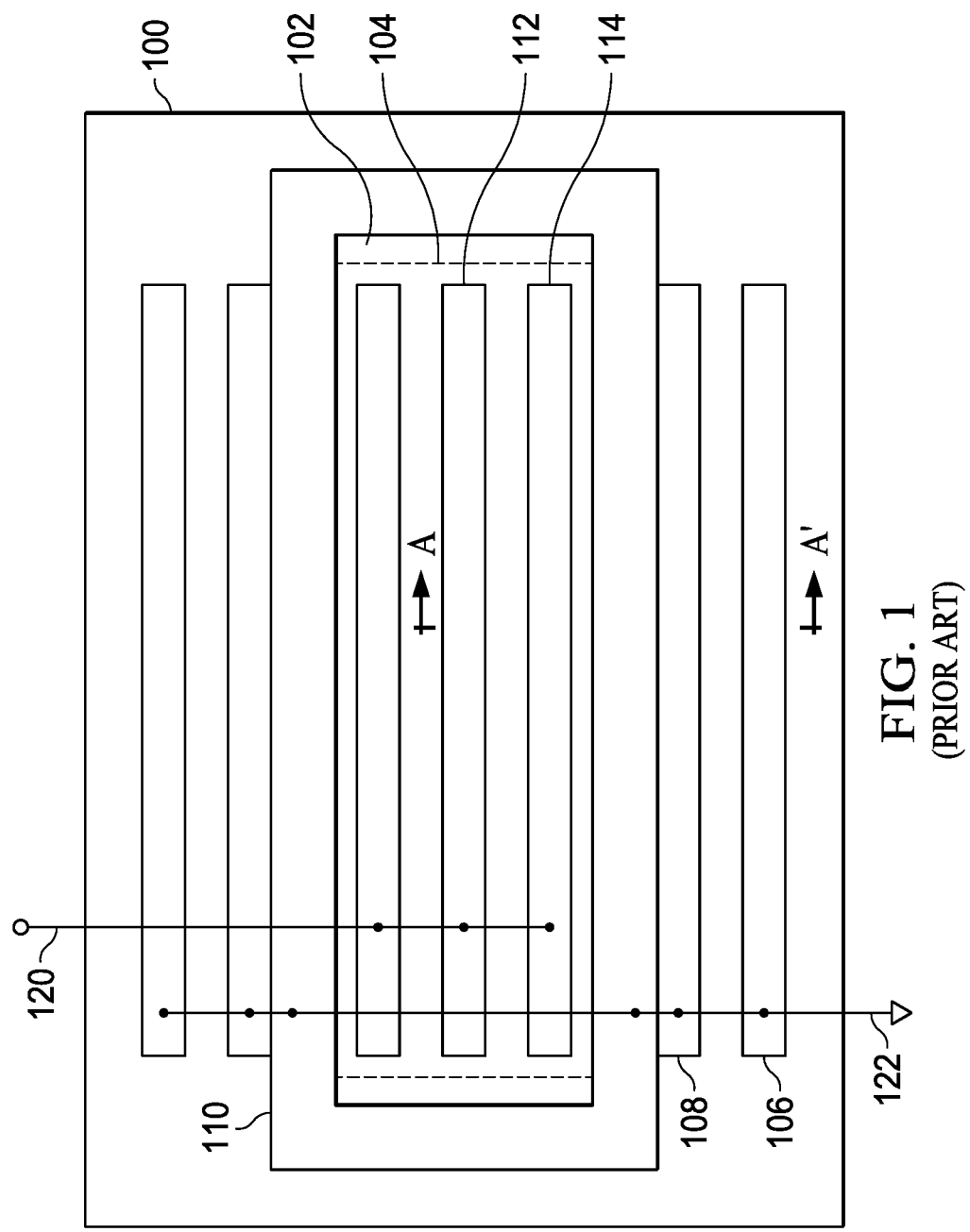
FIG. 1 is a plan view of an enclosed semiconductor controlled rectifier (SCR) of an electrostatic discharge (ESD) protection circuit of the prior art.
Figure 2:
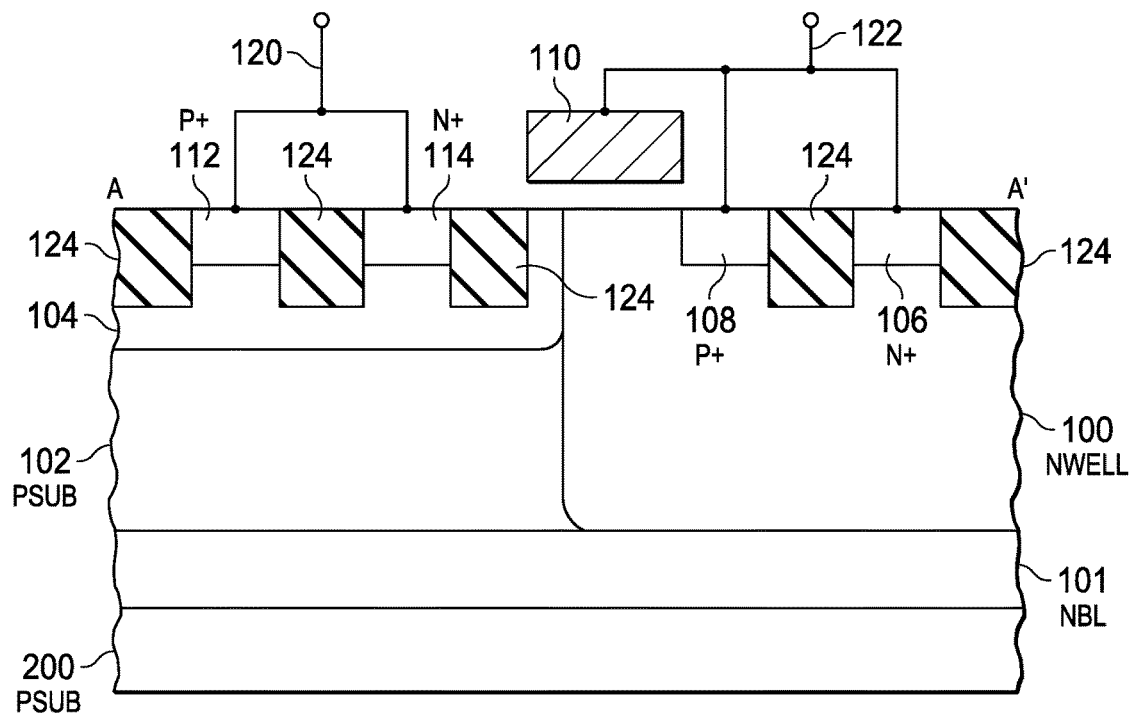
FIG. 2 is a cross sectional diagram along the plane A-A' of the SCR of FIG. 1.
Figure 3:
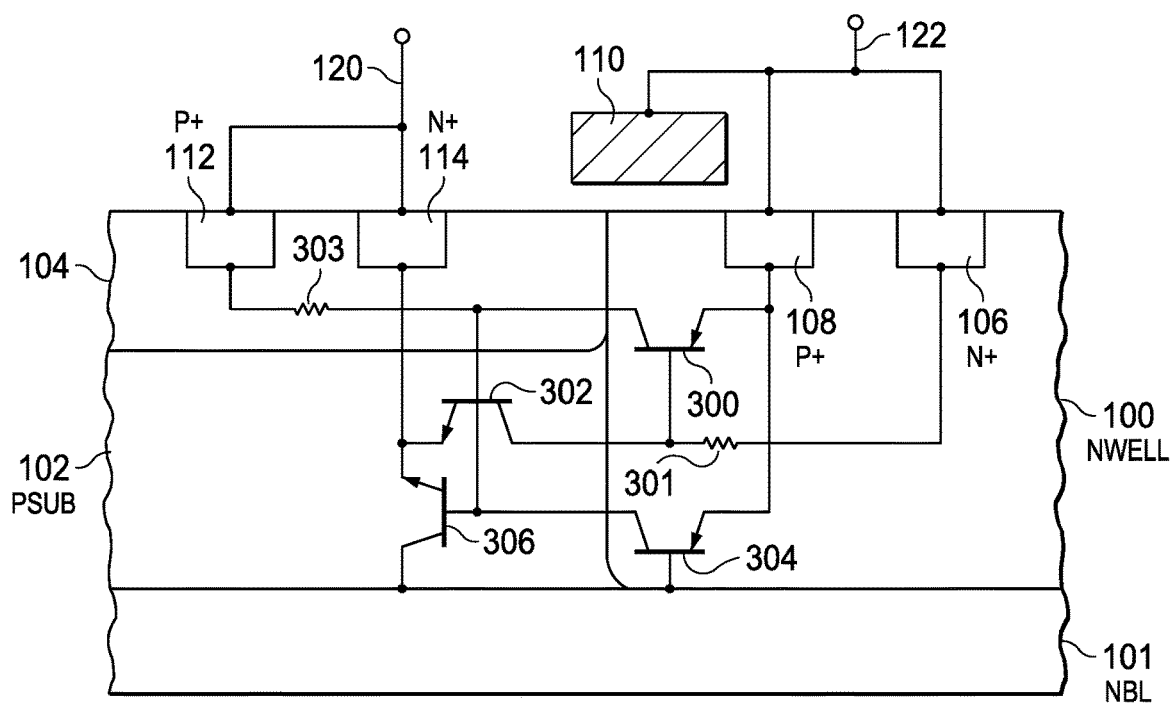
FIG. 3 is a schematic diagram showing individual transistors of the SCR of FIG. 2.

The present inventors have discovered one of the problems with the SCR of FIGS. 1-3 is the limited operating voltage at terminal 120 with respect to reference terminal 122. Present analog circuits may require an operating voltage of −10 V or more at terminal 120 with respect to reference terminal 122. For small feature sizes, however, it was discovered that −6 V applied to terminal 120 with respect to reference terminal 122 would fully deplete lightly doped PSUB region 102 and cause collector-emitter punch through of NPN transistor 306. This problem is solved by a first embodiment of the present invention in which p-type region (PBL) 400 is preferably formed by ion implantation between p-type region 104 and NBL 101. PBL 400 is preferably formed with an impurity concentration between that of p-type region 104 and PSUB 102. If the PBL concentration is too low, collector-emitter punch through of NPN transistor 306 may still occur within the operating voltage range of terminal 120. Alternatively, if the concentration of PBL 400 is too high, lateral collector-base avalanche conduction of NPN transistor 302 will occur.

Figure 4B:
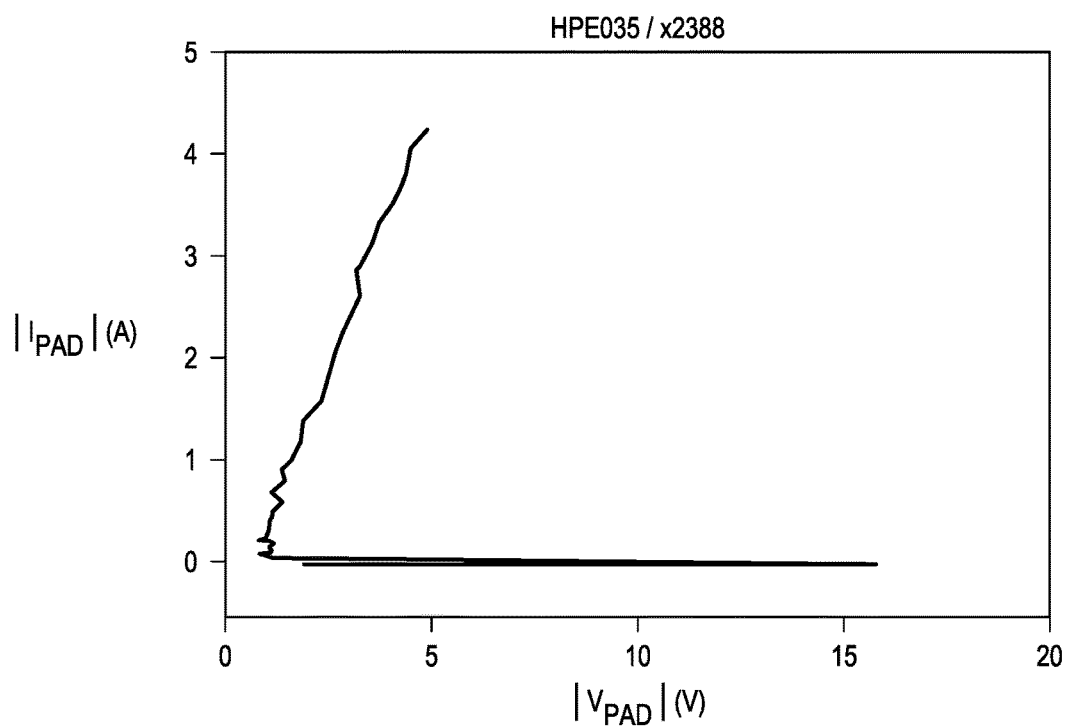
FIG. 4B is a current-voltage diagram of the SCR of FIG. 4A.

Referring now to FIG. 4B, there is a current-voltage diagram of the SCR of FIG. 4A. The absolute voltage at terminal 120 with respect to terminal 122 is shown along the horizontal axis. The absolute current between terminal 120 and 122 is shown along the vertical axis. It is important to note that the trigger voltage of the SCR is now 16 V, rather than 6 V, with no evidence of collector-emitter punch through. Moreover, the holding voltage of the SCR is less than 1 V to provide effective protection against electrostatic discharge (ESD).

Figure 5A:
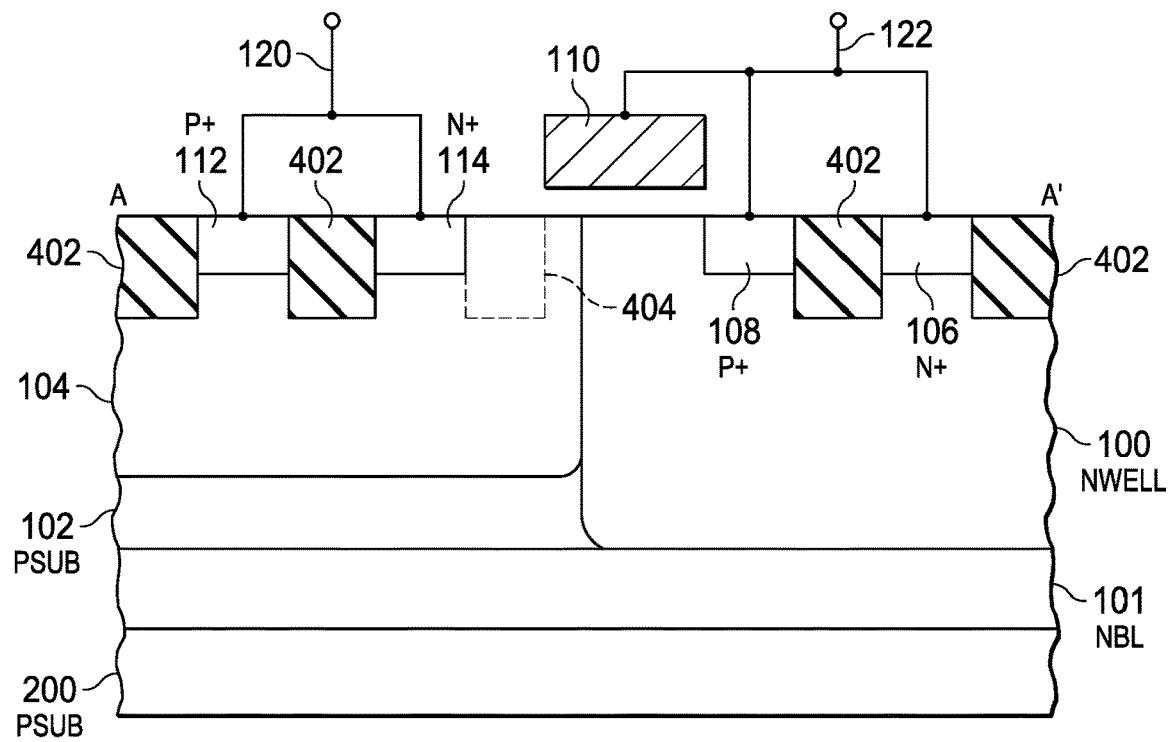
FIG. 5A is a cross sectional diagram of a second embodiment of the SCR of the present invention.
Figure 5B:
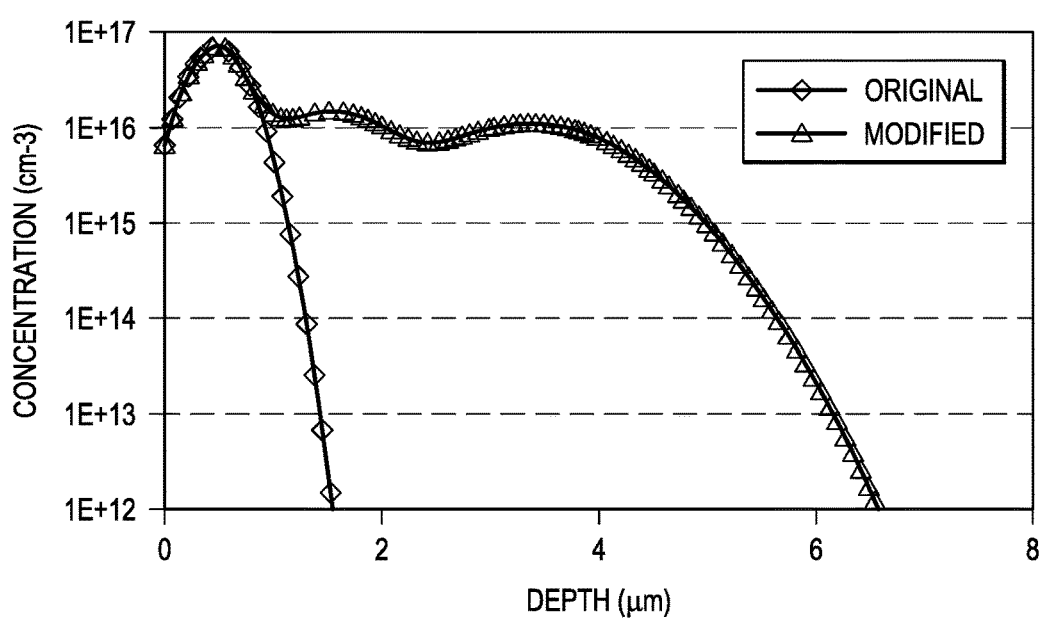
FIG. 5B is a doping profile of p-type well 104 of FIG. 5A.

Turning now to FIG. 5A, there is a second embodiment of the present invention. Here, however, p-type well layer 104 is modified according the impurity concentration diagram of FIG. 5B. The original doping profile is produced by a Boron implant dose of 4e12 Acm$^{-2}$ and energy of 15 keV. In addition, a second Boron implant dose of 1.8e12 Acm$^{-2}$ and energy of 47 keV and a third Boron implant dose of 2e12 Acm$^{-2}$ and energy of 115 keV are performed. The three implants produce three respective overlapping Gaussian distributions of FIG. 5A. The first and original implant produces a maximum concentration of 1.8e16 Acm-3 at 0.5 µm. The second implant produces a maximum concentration of 1.5e16 Acm-3 at 1.6 µm. The third implant produces a maximum concentration of 1.0e16 Acm-3 at 3.4 µm. The resulting doping profile of FIG. 5A advantageously prevents collector-emitter punch through of NPN transistor 306 to −20 V at terminal 120 with respect to reference terminal 122. The progressively decreasing concentration of Boron with increasing implant depth advantageously prevents collector-base avalanche conduction of NPN transistor 306. Since the maximum Boron concentration of the second and third implants is no greater than the original implant, no lateral collector-base avalanche of NPN transistor 302 will occur. Finally, no additional masks are required for the second and third Boron implants.

Figure 6A:
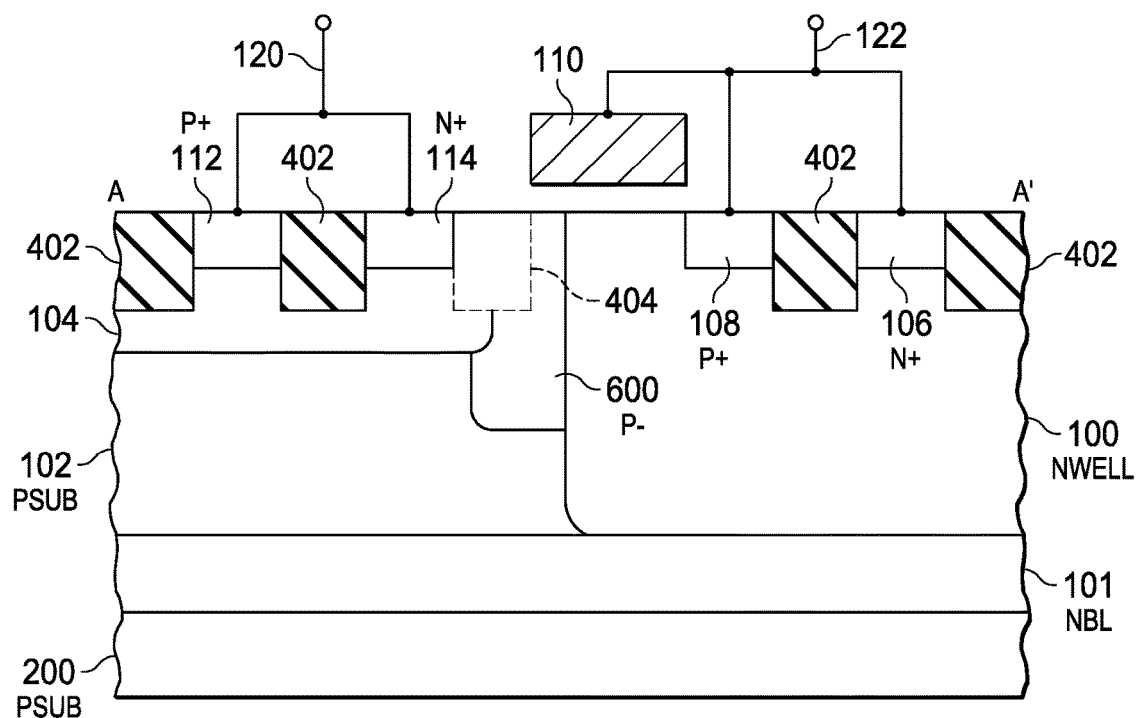
FIGS. 6A-6C are cross sectional diagrams of a third embodiment of the SCR of the present invention.

Referring now to FIG. 6A, there is a first part of a third embodiment of the present invention. The operating voltage of the SCR of FIGS. 1-3 is limited by the electric field between gate 110 and p-type well region 104. This limitation becomes increasingly significant as the dielectric thickness under gate 110 decreases. In the embodiment of FIG. 6A, gate 110 may be necessary when a metal silicide layer is formed over active regions 106, 108, 112, 114, and gate 110. The gate 110 prevents metal silicide formation that might otherwise short p-type well region 104 to NWELL 100. In the embodiment of FIG. 6A, a lightly doped p-type well region 600 is formed by ion implantation between p-type well region 104 and NWELL 100. P-type well region 600 is electrically connected to p-type well region 104 and extends NWELL 100. Region 600 is preferably more lightly doped than either of p-type well region 104 or NWELL 100 to avoid avalanche conduction with NWELL 100. During normal circuit operation, when terminal 120 is negative with respect to terminal 122, an inversion layer connected to NWELL 100 forms at the surface of p-type well region 600. This advantageously avoids any high electric field across the dielectric layer under gate 110 during normal circuit operation as well as during ESD events.

Figure 6B:
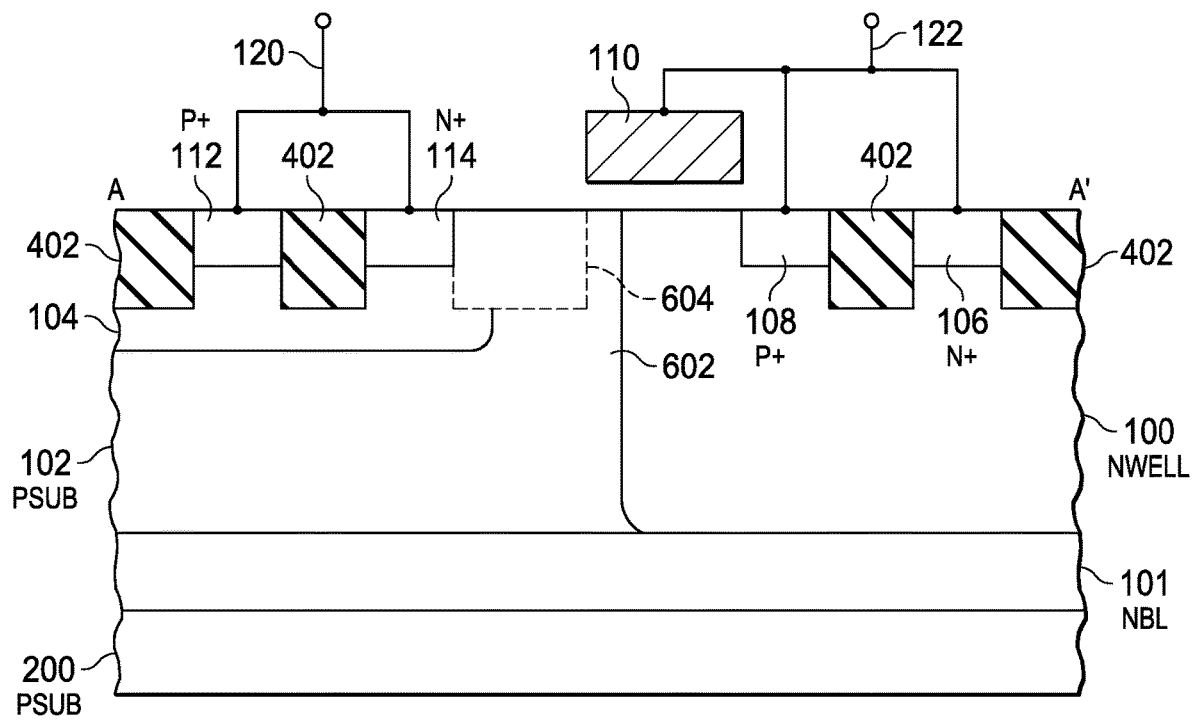

FIG. 6B is a second part of the third embodiment of the present invention. Here, when the space between SCR anode 108 and cathode 114 is sufficiently large it is possible to omit implant region 600 so that region 602 is an extension of PSUB 102. Isolation region 604 may also be optionally omitted to improve the gain of the horizontal SCR. As with FIG. 6A, an inversion layer connected to NWELL 100 forms at the surface of p-type region 602. This advantageously avoids any high electric field across the dielectric layer under gate 110 during normal circuit operation as well as during ESD events.

Figure 6C:
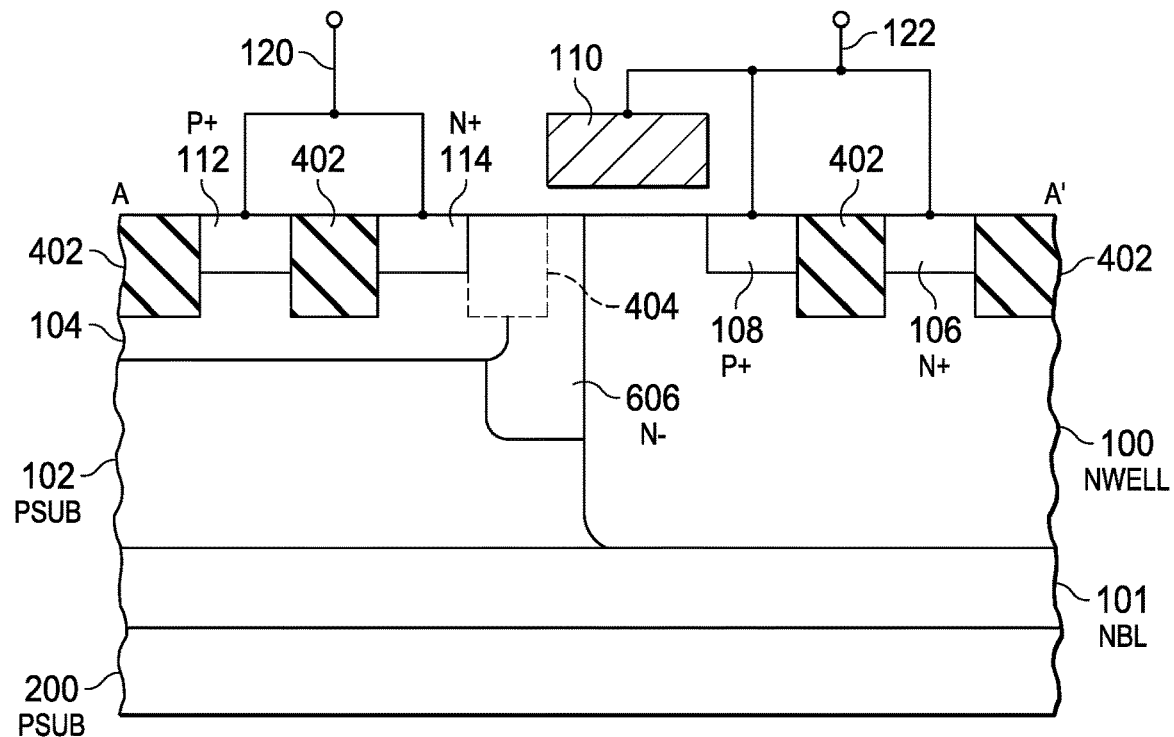

FIG. 6C is a third part of the third embodiment of the present invention. In the embodiment of FIG. 6C, a lightly doped n-type well region 606 is formed by ion implantation between p-type well region 104 and NWELL 100. N-type well region 606 is electrically connected to NWELL 100 and extends to p-type well region 104. Region 606 is preferably more lightly doped than either of p-type well region 104 or NWELL 100 to avoid avalanche conduction with p-type well region 104. During normal circuit operation, when terminal 120 is negative with respect to terminal 122, region 606 under gate 110 remains in accumulation and connected to NWELL 100. This advantageously avoids any high electric field across the dielectric layer under gate 110 during normal circuit operation as well as during ESD events. Alternatively, when not limited by punch through and avalanche conduction, NWELL 100 may be extended to the left to underlie gate 110.

Figure 7:
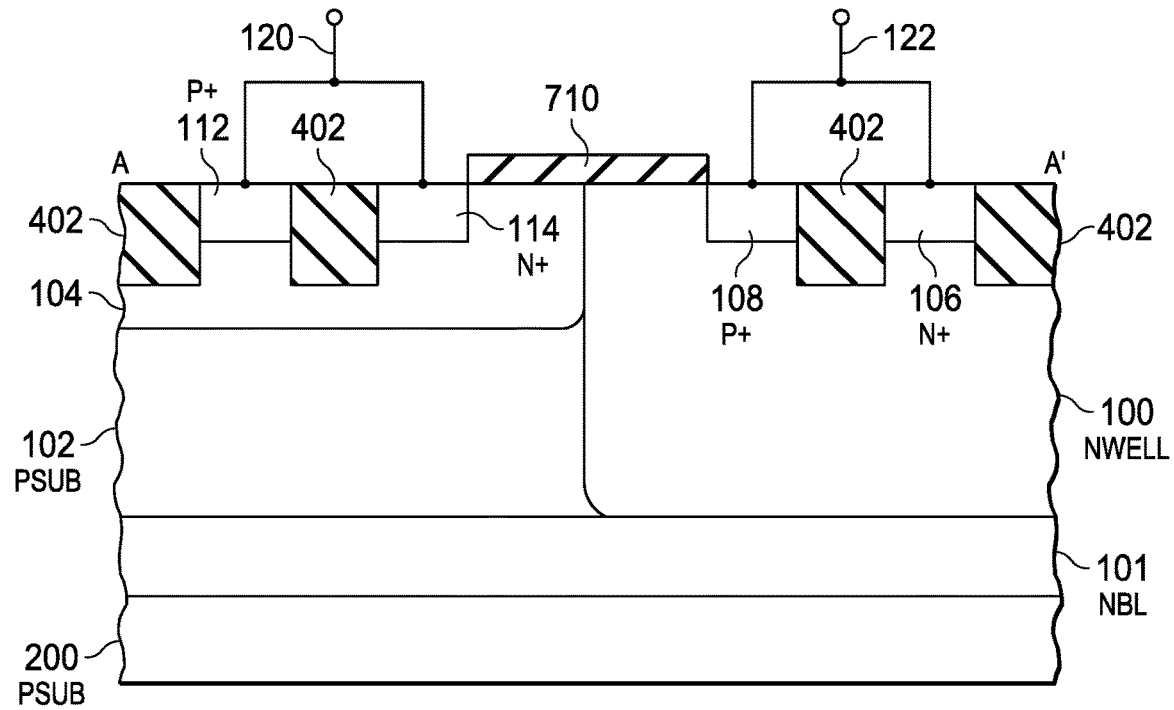
FIG. 7 is a cross sectional diagram of a fourth embodiment of the SCR of the present invention.

Referring next to FIG. 7, there is a fourth embodiment of the present invention. Here, gate 110 and STI 404 (FIG. 6) are removed. Silicide blocking layer 710 is formed over portions of p-type well region 104 and NWELL 100 between N+ cathode 114 and P+ anode 108. The silicide blocking layer is preferably a thin deposited dielectric layer such as $SiO_2$ or a composite dielectric of $SiO_2$ and SiN. The silicide blocking layer 710 advantageously prevents formation of metal silicide that would otherwise short p-type well 104 to NWELL 100. Moreover, gate 110 is removed so there is no high electric field across the dielectric layer 710 during normal circuit operation as well as during ESD events. Removal of STI region 404 advantageously improves the gain of the lateral SCR (FIG. 3) by creating a more direct collector-emitter current path for NPN transistor 302.

Figure 8:
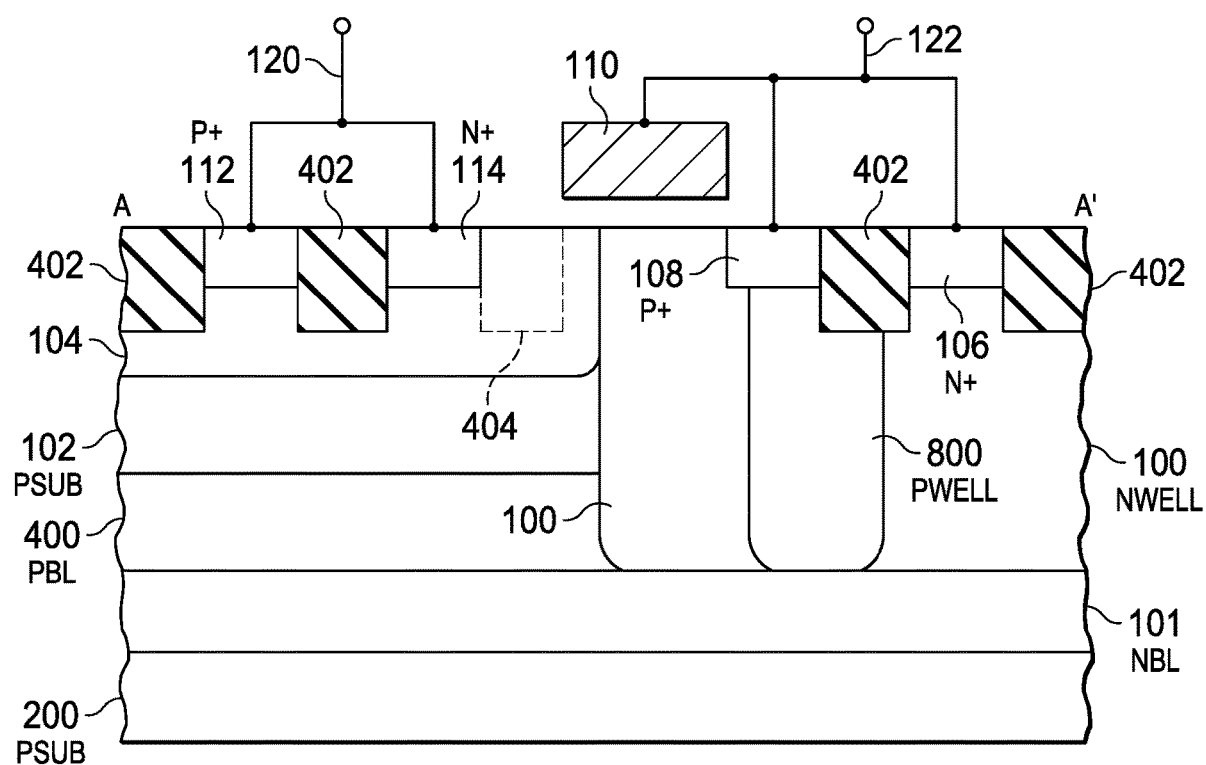
FIG. 8 is a cross sectional diagram of a fifth embodiment of the SCR of the present invention.

Referring now to FIG. 8, there is a fifth embodiment of the present invention. Recall from the discussion of FIG. 3 that resistor 301 is a base-emitter shunt resistor for lateral PNP transistor 300. The present inventors have determined that the gain, trigger voltage, and holding voltage of the lateral SCR formed by PNP transistor 300 and NPN transistor 302 are significantly affected by the value of shunt resistor 301. In order to improve these characteristics of the SCR, p-type (PWELL) region 800 is formed by ion implantation below and electrically connected to P+ anode 108. PWELL region 800 has a slightly higher impurity concentration than NWELL 100 and preferably extends to NBL 101. However, one of ordinary skill in the art having access to the instant specification will understand that SCR characteristics are improved even when PWELL 800 extends any distance below P+ anode 108. This improvement is due to an increase in the value of resistor 301, since the current path through resistor 301 must flow through NWELL 100, below PWELL 800, and up to N+ well contact 106. Therefore, the maximum increase in the value of resistor 301 is advantageously achieved when PWELL 800 extends to NBL 101.

Still further, while numerous examples have thus been provided, one skilled in the art should recognize that various modifications, substitutions, or alterations may be made to the described embodiments while still falling within the inventive scope as defined by the following claims. For example, although the foregoing discussion is specifically directed to an SCR having a negative operating voltage at terminal 120 with respect to reference terminal 122, embodiments of the present invention are equally applicable to an SCR having a positive operating voltage at an input, input-output, or output terminal such as terminal 122 with respect to a reference terminal such as terminal 120. Moreover, although five embodiments of the present invention have been discussed separately, it is to be understood that many of them may be combined in a single improved SCR. Other combinations will be readily apparent to one of ordinary skill in the art having access to the instant specification.

What is claimed is:

1. An integrated circuit, comprising:
a substrate of a second conductivity type; and
semiconductor controlled rectifier including:
a first doped region having a first conductivity type;
a second doped region having the second conductivity type formed within the first doped region;
a third doped region having the second conductivity type formed proximate the first doped region;
a fourth doped region having the first conductivity type formed within the third doped region;
a buried layer having the first conductivity type formed in the substrate below the third doped region and electrically connected to the first doped region, wherein the first doped region extends to the buried layer;
a fifth doped region formed in the first doped region between the second doped region and the buried layer, wherein the fifth doped region has the second conductivity type and is electrically connected to the second doped region; and
a sixth doped region having the first conductivity type formed within the first doped region and directly contacting the first doped region, the sixth doped region having a higher dopant concentration than the first doped region, wherein the sixth doped region is located on an opposite side of the fifth doped region from the third doped region;
wherein the fifth doped region extends deeper in the substrate than the second doped region and the sixth doped region.

2. An integrated circuit as in claim 1, further comprising shallow trench isolation regions, wherein no shallow trench isolation region is between the second doped region and the fourth doped region.

3. An integrated circuit as in claim 1, comprising a gate formed over a junction between the first doped region and the third doped region, wherein the gate is electrically connected to the second doped region.

4. An integrated circuit as in claim 1, comprising:
an eighth doped region having the second conductivity type and electrically connected to the fourth doped region and the third doped region.

5. An integrated circuit as in claim 1, wherein the third doped region is electrically isolated from the substrate by the first doped region and the buried layer.

6. An integrated circuit, comprising:
a semiconductor body having a surface and including a p-type substrate; and
semiconductor controlled rectifier including:
a first n-type doped region;
a first p-type doped region formed within the first n-type doped region;
a second p-type doped region formed proximate the first n-type doped region;
a second n-type doped region formed within the second p-type doped region;
a n-type buried layer formed in the substrate below the second p-type doped region and electrically connected to the first n-type doped region, wherein the first n-type doped region extends to the n-type buried layer;
a third p-type doped region formed between the first p-type doped region and the n-type buried layer and electrically connected to the first p-type doped region; and a third n-type doped region formed within the first n-type doped region and directly contacting the first n-type doped region, the third n-type region having a higher dopant concentration than the first n-type doped region, wherein the third n-type doped region is located on an opposite side of the third p-type doped region from the second p-type doped region; wherein the third p-type doped region extends deeper in the substrate than the third n-type doped region and the first p-type doped region.

7. An integrated circuit as in claim 6, comprising a gate formed over a junction between the first n-type doped region and the second p-type doped region, wherein the gate is electrically connected to the first p-type doped region.

8. An integrated circuit as in claim 7, comprising:
a fourth p-type doped region electrically connected to the second n-type doped region and the second p-type doped region.

9. An integrated circuit as in claim 8, further comprising shallow trench isolation regions, wherein no shallow trench isolation region is between the first n-type doped region and the second n-type doped region.

10. An integrated circuit as in claim 9, comprising a fifth p-type doped region formed between the second p-type doped region and the n-type buried layer.

11. An integrated circuit, comprising:
a semiconductor body having a surface;
a first doped region having a first conductivity type and a first depth from the surface of the semiconductor body;
a second doped region having a second conductivity type formed within the first doped region;
a third doped region having the second conductivity type and a second depth from the surface of the semiconductor body, the third doped region formed proximate the first doped region;
a fourth doped region having the first conductivity type formed within the third doped region;
a buried layer having the first conductivity type formed below the third doped region and electrically connected to the first doped region, wherein the first doped region extends to the buried layer; and
a fifth doped region formed between and touching both the first doped region and the third doped region, wherein the fifth doped region has a third depth from the surface of the semiconductor body, the third depth being less than the first depth and greater than the second depth and wherein the fifth doped region has the first conductivity type and is electrically connected to the first doped region.

12. An integrated circuit as in claim 11, further comprising shallow trench isolation regions, wherein no shallow trench isolation region is between the second doped region and the fourth doped region.

13. An integrated circuit as in claim 11, comprising a fourth lightly doped region having the second conductivity type formed between the second doped region and the buried layer and electrically connected to the second doped region.

14. An integrated circuit as in claim 11, comprising a gate formed over a junction between the first doped region and the third doped region, wherein the gate is electrically connected to the second doped region.

15. An integrated circuit as in claim 11, comprising:
a fourth heavily doped region having the first conductivity type and electrically connected to the second doped region and the first doped region; and
a fifth heavily doped region having the second conductivity type and electrically connected to the fourth doped region and the third doped region.

16. An integrated circuit as in claim 11, wherein the semiconductor body includes a substrate having the second conductivity type, and wherein the third doped region is electrically isolated from the substrate by the first doped region and the buried layer.

17. An integrated circuit, comprising:
a semiconductor body having a surface and including a p-type substrate; and
semiconductor controlled rectifier including:
a first n-type doped region having a first depth from the surface of the semiconductor body;
a first p-type doped region formed within the first n-type doped region;
a second p-type doped region formed proximate the first n-type doped region;
a second n-type doped region formed within the second p-type doped region;
a n-type buried layer formed in the substrate below the second p-type doped region and electrically connected to the first n-type doped region, wherein the first n-type doped region extends to the n-type buried layer; and
a third n-type doped region formed between and touching both the first n-type doped region and the second p-type doped region, wherein the third n-type doped region has a second depth from the surface of the semiconductor body, the second depth being less than the first depth, wherein the third n-type doped region has a dopant concentration less than the first n-type doped region, and wherein the third n-type doped region is electrically connected to the first n-type doped region.

18. An integrated circuit as in claim 17, comprising a gate formed over a junction between the first n-type doped region and the second p-type doped region, wherein the gate is electrically connected to the first p-type doped region.

19. An integrated circuit as in claim 18, comprising:
a fourth n-type doped region electrically connected to the first p-type doped region and the first n-type doped region; and
a third p-type doped region electrically connected to the second n-type doped region and the second p-type doped region.

20. An integrated circuit as in claim 19, further comprising shallow trench isolation regions, wherein no shallow trench isolation region is between the first p-type doped region and the second n-type doped region.

21. An integrated circuit as in claim 20, comprising a fourth p-type doped region formed between the first p-type doped region and the n-type buried layer and electrically connected to the first p-type doped region.

22. An integrated circuit as in claim 20, wherein the second p-type doped region is electrically isolated from the substrate by the first n-type doped region and the n-type buried layer.

23. An integrated circuit, comprising:
a semiconductor body having a surface and including a p-type substrate; and
semiconductor controlled rectifier including:
an n-type buried layer separating a first p-type substrate region above the buried layer from a second p-type substrate region below the n-type buried layer;

a first n-type doped region extending from the surface to the n-type buried layer, the n-type buried layer electrically connected to the first n-type doped region;

a first p-type doped region within the first n-type doped region;

a second p-type doped region proximate the first n-type doped region and separated from the n-type buried layer by a portion of the first p-type substrate region;

a second n-type doped region within the second p-type doped region;

a third n-type doped region within the first n-type doped region;

a third p-type doped region within the second p-type region;

a first oxide isolation structure between the first p-type doped region and the third n-type doped region;

a second oxide isolation structure between the second n-type doped region and the third p-type doped region; and a silicide blocking layer over a junction between the first n-type doped region and the second p-type doped region, wherein no oxide isolation structure is present between the second n-type doped region and the first p-type doped region.

* * * * *